US010808154B2

(12) United States Patent
Gubbels et al.

(10) Patent No.: US 10,808,154 B2
(45) Date of Patent: *Oct. 20, 2020

(54) ELASTOMERIC COMPOSITIONS AND THEIR APPLICATIONS

(71) Applicant: Dow Silicones Corporation, Midland, MI (US)

(72) Inventors: Frederic Gubbels, Seneffe (BE); Thomas Seldrum, Seneffe (BE)

(73) Assignee: DOW SILICONES CORPORATION, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/322,651

(22) PCT Filed: Aug. 3, 2017

(86) PCT No.: PCT/EP2017/069753
§ 371 (c)(1),
(2) Date: Feb. 1, 2019

(87) PCT Pub. No.: WO2018/024865
PCT Pub. Date: Feb. 8, 2018

(65) Prior Publication Data
US 2019/0177584 A1    Jun. 13, 2019

(30) Foreign Application Priority Data

Aug. 3, 2016 (GB) ..................... 1613414.0

(51) Int. Cl.
| | |
|---|---|
| *C08K 5/56* | (2006.01) |
| *C08L 83/04* | (2006.01) |
| *C08K 3/08* | (2006.01) |
| *C08K 3/20* | (2006.01) |
| *C08L 83/00* | (2006.01) |
| *C08K 3/28* | (2006.01) |
| *C09J 183/06* | (2006.01) |
| *H05K 1/02* | (2006.01) |
| *C08K 3/22* | (2006.01) |
| *C08G 77/18* | (2006.01) |
| *C08G 77/16* | (2006.01) |
| *C08K 3/013* | (2018.01) |
| *C08K 5/5419* | (2006.01) |
| *C08K 5/57* | (2006.01) |

(52) U.S. Cl.
CPC .............. *C09J 183/06* (2013.01); *C08K 3/08* (2013.01); *C08K 3/20* (2013.01); *C08K 3/28* (2013.01); *C08K 5/56* (2013.01); *C08L 83/00* (2013.01); *C08L 83/04* (2013.01); *H05K 1/0209* (2013.01); *C08G 77/16* (2013.01); *C08G 77/18* (2013.01); *C08K 3/013* (2018.01); *C08K 3/22* (2013.01); *C08K 5/5419* (2013.01); *C08K 5/57* (2013.01); *C08K 2003/0806* (2013.01); *C08K 2003/0812* (2013.01); *C08K 2003/2227* (2013.01); *C08K 2003/2296* (2013.01); *C08K 2201/001* (2013.01); *C08K 2201/005* (2013.01); *C09J 2203/326* (2013.01); *C09J 2301/408* (2020.08)

(58) Field of Classification Search
CPC ................ C09J 183/06; C09J 2203/326; C09J 2205/102; C08K 5/56; C08K 5/57; C08K 5/5419; C08K 3/08; C08K 3/20; C08K 3/28; C08K 3/013; C08K 3/22; C08K 2203/2227; C08K 2203/0812; C08L 83/04; C08L 83/00; C08G 77/18; C08G 77/16
USPC ....................................................... 524/430
See application file for complete search history.

(56) References Cited

U.S. PATENT DOCUMENTS

| | | |
|---|---|---|
| 3,419,516 A | 12/1968 | Tamo |
| 4,087,585 A | 5/1978 | Schulz |
| 4,754,013 A | 6/1988 | Antonen |
| 5,126,389 A * | 6/1992 | Ona .................. C08K 13/02 524/262 |
| 5,194,649 A | 3/1993 | Okawa |
| 5,281,455 A * | 1/1994 | Braun ................ C09D 183/08 428/40.7 |
| 5,300,171 A | 4/1994 | Braun et al. |
| 5,684,110 A | 11/1997 | Kawamura |
| 5,804,631 A | 9/1998 | Mine et al. |
| 5,840,794 A | 11/1998 | Palmer |
| 6,169,142 B1 | 1/2001 | Nakano et al. |
| 6,593,413 B2 | 1/2002 | Muramatsu et al. |
| 6,534,581 B1 | 3/2003 | Kleyer et al. |
| 6,642,309 B2 | 11/2003 | Komitsu et al. |
| 7,144,953 B2 | 12/2006 | Ueda et al. |

(Continued)

FOREIGN PATENT DOCUMENTS

| | | |
|---|---|---|
| CN | 105440693 A | 3/2016 |
| EP | 0539234 A2 | 4/1993 |

(Continued)

OTHER PUBLICATIONS

International Search Report for related Application No. PCT/EP2017/069753, dated Nov. 14, 2017, 3 pages.

(Continued)

*Primary Examiner* — Michael Bernshteyn
(74) *Attorney, Agent, or Firm* — Warner Norcross + Judd LLP

(57) ABSTRACT

The present disclosure generally relates to thermally conductive silicone compositions and elastomer and gels prepared from a multi-part condensation cure composition catalysed by titanium or zirconium based catalysts. Applications of the resulting thermally conductive silicone elastomers and gels are also considered.

16 Claims, No Drawings

(56) References Cited

U.S. PATENT DOCUMENTS

| | | | |
|---|---|---|---|
| 7,417,105 | B2 | 8/2008 | Landon et al. |
| 7,893,170 | B2 | 2/2011 | Wakioka et al. |
| 7,951,458 | B2 | 5/2011 | Ogura et al. |
| 7,973,108 | B2 | 7/2011 | Okamoto et al. |
| 8,030,371 | B2 | 10/2011 | Chaussade |
| 8,231,944 | B1 | 7/2012 | Schroeder |
| 8,609,797 | B2 | 12/2013 | Knepper et al. |
| 8,686,094 | B2 | 4/2014 | Djurdjevic et al. |
| 8,785,537 | B2 | 7/2014 | Carrard et al. |
| 8,801,890 | B2 | 8/2014 | Verosky et al. |
| 9,051,435 | B2 * | 6/2015 | Takei .................. C08G 77/08 |
| 9,493,689 | B2 | 11/2016 | Stanjek et al. |
| 9,527,985 | B2 | 12/2016 | Okamatsu |
| 9,732,203 | B2 | 8/2017 | Okamatsu |
| 10,150,888 | B2 | 12/2018 | Simon et al. |
| 10,414,907 | B2 | 9/2019 | Takahara |
| 2002/0010251 | A1 | 1/2002 | Muramatsu et al. |
| 2006/0194067 | A1 | 8/2006 | Beger et al. |
| 2007/0173597 | A1 | 7/2007 | Williams et al. |
| 2007/0237912 | A1 | 10/2007 | Correia |
| 2007/0244249 | A1 | 10/2007 | Correia |
| 2007/0282047 | A1 | 12/2007 | Kimura et al. |
| 2011/0028646 | A1 * | 2/2011 | Sixt .................. C08G 77/14 |
| | | | 524/858 |
| 2011/0248314 | A1 | 10/2011 | Takei et al. |
| 2012/0022209 | A1 * | 1/2012 | Djurdjevic .......... C09D 183/04 |
| | | | 524/588 |
| 2012/0123537 | A1 | 5/2012 | Manesis et al. |
| 2014/0235812 | A1 | 8/2014 | Brandstadt et al. |
| 2014/0238471 | A1 | 8/2014 | Wakita et al. |
| 2014/0256539 | A1 * | 9/2014 | Takei .................. C08G 77/08 |
| | | | 502/170 |
| 2014/0350176 | A1 | 11/2014 | Fisher et al. |
| 2015/0007938 | A1 | 1/2015 | Stanjek et al. |
| 2015/0166859 | A1 | 6/2015 | Choffat et al. |
| 2015/0183951 | A1 * | 7/2015 | Bhagwagar .......... C09J 183/14 |
| | | | 524/430 |
| 2015/0315437 | A1 | 11/2015 | Albaugh et al. |
| 2013/0338289 | A1 | 12/2015 | Jadot et al. |
| 2017/0002201 | A1 | 1/2017 | Von Malotki et al. |
| 2018/0009951 | A1 | 1/2018 | Gubbels et al. |
| 2019/0177486 | A1 | 6/2019 | Baily et al. |
| 2019/0338077 | A1 | 11/2019 | Chambard et al. |
| 2020/0140617 | A1 | 5/2020 | Gubbels et al. |
| 2020/0190324 | A1 | 6/2020 | Gubbels |

FOREIGN PATENT DOCUMENTS

| | | | | |
|---|---|---|---|---|
| EP | 2013289 | B1 | 6/2016 | |
| GB | 2424898 | A | 10/2006 | |
| JP | S5269460 | A | 6/1977 | |
| JP | S63172768 | A | 7/1988 | |
| JP | H0359174 | A | 3/1991 | |
| JP | H05194917 | A | 8/1993 | |
| JP | H05200935 | A | 8/1993 | |
| JP | H08269331 | A | 10/1996 | |
| JP | H08302193 | A | 11/1996 | |
| JP | 2001200161 | A | 7/2001 | |
| JP | 2006342327 | A | 12/2006 | |
| JP | 2007119695 | A | 5/2007 | |
| JP | 2010248446 | A | 11/2010 | |
| JP | 2011032473 | A | 2/2011 | |
| JP | 2011137119 | A | 7/2011 | |
| JP | 2012251058 | A | 12/2012 | |
| JP | 2013234245 | A | 11/2013 | |
| KR | 20110094109 | A | 8/2011 | |
| WO | 2001042365 | A | 6/2001 | |
| WO | 2001096463 | A2 | 12/2001 | |
| WO | 2005108499 | A1 | 11/2005 | |
| WO | 2007117552 | A1 | 10/2007 | |
| WO | 2008045395 | A2 | 4/2008 | |
| WO | 2009013309 | A1 | 1/2009 | |
| WO | 2010143357 | A1 | 12/2010 | |
| WO | 2013100175 | A1 | 7/2013 | |
| WO | WO-2013100175 | A1 * | 7/2013 | .............. C08L 83/04 |
| WO | 2014022377 | A1 | 2/2014 | |
| WO | 2015091396 | A1 | 6/2015 | |
| WO | 2016120270 | A1 | 8/2016 | |
| WO | WO-2016120270 | A1 * | 8/2016 | ........... C09D 183/04 |
| WO | 2017030128 | A1 | 2/2017 | |
| WO | 2017191322 | A1 | 11/2017 | |
| WO | 2018024856 | A1 | 2/2018 | |
| WO | 2018024857 | A1 | 2/2018 | |
| WO | 2018024858 | A1 | 2/2018 | |
| WO | 2018024860 | A1 | 2/2018 | |
| WO | 2018050503 | A1 | 3/2018 | |
| WO | 2018200796 | A1 | 11/2018 | |

OTHER PUBLICATIONS

International Preliminary Report on Patentability including Transmittal and Annex for related Application No. PCT/EP2017/069753, dated Jun. 26, 2018, 14 pages.

Noll, W., "Chemistry and Technology of Silicones," Academic Press Inc., New York, 1968, p. 397, 399.

Michael A. Brook, "Silicon in Organic, Organometallic and Polymer Chemistry," John Wiley & Sons, Inc., 2000, p. 285.

International Search Report for PCT Application No. PCT/EP2017/069744, dated Nov. 9, 2017, 3 pages.

International Preliminary Report on Patentability with Transmittal and Annex for Application No. PCT/EP2017/069744, dated Jul. 10, 2018, 13 pages.

International Standard (ISO), "General methods of test for pigments and extenders—Part 2: Determination of matter volatile at 105C", 787-2, 1981.

Machine assisted English translation of JP2011137119A obtained from https://patents.google.com on Jan. 22, 2020, 11 pages.

Machine assisted English translation of JPS5269460A obtained from https://worldwide.espacenet.com on Nov. 18, 2019, 10 pages.

Machine assisted English translation of JP2001200161A obtained from https://patents.google.com on Nov. 18, 2019, 7 pages.

Machine assisted English translation of JP2007119695A obtained from https://patents.google.com on Nov. 18, 2019, 11 pages.

Machine assisted English translation of WO2010143357A1 obtained from https://patents.google.com on Nov. 18, 2019, 26 pages.

Machine assisted English translation of JP2011137119A obtained from https://patents.google.com/patent on Apr. 7, 2020, 14 pages.

* cited by examiner

ELASTOMERIC COMPOSITIONS AND THEIR APPLICATIONS

CROSS-REFERENCE TO RELATED APPLICATIONS

This application is the National Stage of International Application No. PCT/EP2017/069753 filed on 3 Aug. 2017, which claims priority to and all advantages of Great Britain Patent Appl. No. 1613414.0 filed on 3 Aug. 2016, the content of which is hereby incorporated by reference.

The present disclosure generally relates to thermally conductive silicone compositions and elastomer and gels cured via a condensation cure chemistry and their applications.

The properties of organosiloxane elastomers and resins make them desirable for a variety of end use applications in the field of electronics. These materials are used to coat and encapsulate solid state electronic devices and the circuit boards on which these devices are often mounted. To function reliably over a long period of time transistors, integrated circuits and other solid state electronic devices must be protected from contact with moisture, corrosive materials and other impurities present in the environment in which these devices operate. While organosiloxane compositions effectively protect solid state devices from materials that can adversely affect their operation, they typically do not possess the thermal conductivity required to dissipate the large amounts of heat generated during operation of some solid state devices.

The rapidly advancing state of the electronics art in recent years has made it possible to reduce the size of solid state devices in response to a demand for more compact circuitry. As more of these devices are crowded into a given area to decrease the over-all size of the equipment incorporating these devices, the passage of air resulting from convection currents is no longer sufficient to dissipate the amount of heat generated at a rate that will avoid damage to the solid state devices.

One method for increasing heat dissipation is to increase the thermal conductivity of the materials used to coat or encapsulate the solid state devices. This increase in thermal conductivity can be achieved by addition of thermally conductive fillers to the coating or encapsulating material.

The resulting thermally conductive elastomers are elastomeric materials primarily used in electronics applications in instances where good thermal conduction and electrical insulation are needed in the same material. For example, a thermally conductive elastomer may be used as an interface between a semiconductor electronic component and a metal heat sink.

Many electronic designs and applications are linked by the ability to dissipate ohmic heat generated during the operation of the electronics. Many electronic components, especially semiconductor components, are prone to breakdown at high temperatures. Thus, the ability to dissipate heat is a limiting factor on the performance of the electronic component.

Since high thermal conductivity metal heat sinks, because of their high electrical conductivity, cannot be directly contacted with electronic components, thermally conductive elastomer material is used as a thermally conductive, electrically insulating interface between the electronic component and the metal heat sink. The thermal conductivity of thermally conductive elastomers is generally much less than that of the metal heat sink. Thus, the thermal conductivity of the thermally conductive elastomer limits the overall ability to dissipate ohmic heat.

The commercial silicone materials that are currently used to form the encapsulants and pottants etc. (e.g. gels) are expensive being based on addition cure chemistry, i.e. they are cured by the reaction of a silicon hydride group with an unsaturated carbon radical with the help of a catalyst, which is typically a platinum based compound. Historically the industry has preferred addition cure compositions of this type for these applications because they immediately cure throughout the body of the compound resulting in a cured material in a matter of minutes whilst condensation cure systems are significantly slower, titanate cured condensation processes can take e.g. up to 7 days curing per 6 mm of depth of the body of the uncured material. Tin cured condensation systems do cure over a shorter period but they are not desired for e.g. electronics applications because they undergo reversion (i.e. depolymerisation) at temperatures above 80° C.

Whilst from a cure speed standpoint materials made from hydrosilylation cure compositions are excellent there are several potential problems and/or disadvantages with their use. For example, they are generally cured at elevated temperature (i.e. in excess of 100° C.) and can be contaminated and rendered uncurable due to inactivation of expensive platinum based cure catalysts which are sensitive and may be poisoned by amine containing compounds, sulphur containing compounds and phosphorus containing compounds.

It is well known to people skilled in the art that alkoxy titanium compounds—i.e. alkyl titanates—are suitable catalysts for formulating one component moisture curable silicones (References: Noll, W.; Chemistry and Technology of Silicones, Academic Press Inc., New York, 1968, p. 399, Michael A. Brook, silicon in organic, organometallic and polymer chemistry, John Wiley & sons, Inc. (2000), p. 285). Titanate catalysts have been widely described for their use to formulate skin or diffusion cured one-part condensation curing silicone elastomers. These formulations are typically available in one-part packages that are applied in a layer that is thinner than typically 15 mm. Layers thicker than 15 mm are known to lead to uncured material in the depth of the material, because the moisture is very slow to diffuse in very deep sections. Skin or diffusion cure (e.g. moisture/condensation) takes place when the initial cure process takes place by the formation of a cured skin at the composition/air interface subsequent to the sealant/encapsulant being applied on to a substrate surface. Subsequent to the generation of the surface skin the cure speed is dependent on the speed of diffusion of moisture from the sealant/encapsulant interface with air to the inside (or core), and the diffusion of condensation reaction by-product/effluent from the inside (or core) to the outside (or surface) of the material and the gradual thickening of the cured skin over time from the outside/surface to the inside/core.

Multi component compositions designed to activate condensation cure in the bulk of the product do not use titanium based catalysts. They generally use other metal catalysts such as tin or zinc catalyst, e.g. dibutyl tin dilaurate, tin octoate and/or zinc octoate (Noll, W.; Chemistry and Technology of Silicones, Academic Press Inc., New York, 1968, p. 397). In silicone compositions stored before use in two or more parts, one-part contains a filler which typically contains the moisture required to activate condensation cure in the bulk of the product. Unlike the previously mentioned diffusion cure one-part system, two-part condensation cure systems, once mixed together, enable bulk cure even in sections greater than 15 mm in depth. In this case the composition will cure (subsequent to mixing) throughout the material bulk. If a skin is formed, it will be only in the first minutes after application. Soon after, the product will become a solid in the entire mass. Titanate catalysts are not used for curing these types of two part compositions because it is well known that in the presence of a significant amount of moisture alkyl titanate catalysts will fully hydrolyse to form tetrahydroxy titanate, which is insoluble in silicone. This form of titanium loses its catalytic efficiency, leading to uncured systems.

There is a need for a reversion free 2 part condensation cure thermally conductive silicone.

The present invention provides a reversion free multipart, condensation curable, thermally conductive silicone adhesive composition comprising:
(i) at least one condensation curable silyl terminated polymer having at least one, typically at least two hydroxyl functional groups per molecule;
(ii) a cross-linker selected from the group of
    silanes having at least 2 hydrolysable groups, alternatively at least 3 hydrolysable groups per molecule group; and/or
    silyl functional molecules having at least 2 silyl groups, each silyl group containing at least one hydrolysable group or a mixture thereof
(iii) at least one condensation catalyst selected from the group of titanates and/or zirconates, and
(iv) one or more thermally conductive fillers
    wherein component (i), (ii) and (iii) are not contained in the same part and wherein the molar ratio of total silicon bonded hydroxyl groups to total hydrolysable groups is between 0.2:1 to 2:1 using a silane cross linker or 0.2:1 to 10:1 using silyl functional molecule crosslinker and the molar ratio of catalyst M-OR functions to the total silicon bonded hydroxyl groups in polymer (i) is comprised between 0.01:1 and 0.5:1, where M is titanium or zirconium.

There is also provided a reversion free thermally conductive silicone adhesive cured from a composition comprising:
(i) at least one condensation curable silyl terminated polymer having at least one, typically at least two hydroxyl functional groups per molecule;
(ii) a cross-linker selected from the group of
    silanes having at least 2 hydrolysable groups, alternatively at least 3 hydrolysable groups per molecule group; and/or
    silyl functional molecules having at least 2 silyl groups, each silyl group containing at least one hydrolysable group or a mixture thereof
(iii) at least one condensation catalyst selected from the group of titanates and/or zirconates, and
(iv) one or more thermally conductive fillers
    wherein component (i), (ii) and (iii) are not contained in the same part and wherein the molar ratio of total silicon bonded hydroxyl groups to total hydrolysable groups is between 0.2:1 to 2:1 using a silane cross linker or 0.2:1 to 10:1 using silyl functional molecule crosslinker and the molar ratio of catalyst M-OR functions to the total silicon bonded hydroxyl groups in polymer (i) is comprised between 0.01:1 and 0.5:1, where M is titanium or zirconium.

The adhesive is in the form of a gel or elastomer. It is to be understood that for the sake of this application that "total hydrolysable groups" excludes both moisture and silicon bonded hydroxyl groups present in the composition.

The total silicon bonded hydroxyl (Si—OH) molar content is calculated for 100 g of the mixed formulation. The total silicon bonded hydroxyl molar content related to a polymer is equal to the amount in g of hydroxyl containing polymer in 100 g of the mixed product divided by the number average molecular weight (Mn) of the polymer multiply by the average number of hydroxyl functions present in the polymer, typically 2. If there are several hydroxyl functional polymers in the formulation, the sum of the molar content of each polymer is sum up to constitute the total silanol molar content in the formulation.

The total hydrolysable groups molar content is calculated for 100 g of the mixed formulation. The molar content of hydrolysable groups related to a substance is equal to the amount in g of the molecule that contains the hydrolysable groups in 100 g of the mixed product divided by the molecular weight of the molecule or the number average molecular weight (Mn) in case it is a polymeric molecule multiply by the average number of hydrolysable functions present in the molecule. The sum of the molar content of each molecule or polymer is sum up to constitute the total molar content of hydrolysable groups in the formulation.

The molar ratio of total silicon bonded hydroxyl groups to total hydrolysable groups is then calculated by dividing the total molar content of silicon bonded hydroxyl (Si—OH) groups by the total molar content of hydrolysable groups. The catalyst M-OR value is =[(g of Titanate catalyst)* (number of OR in compound)] divided by the (molecular weight of Titanium catalyst).

The number average molecular weight (Mn) and weight average molecular weight (Mw) of silicone can also be determined by Gel permeation chromatography (GPC). This technique is a standard technique, and yields values for Mw (weight average), Mn (number average) and polydispersity index (PI) (where PI=Mw/Mn).

Mn value provided in this application have been determined by GPC and represent a typical value of the polymer used. If not provided by GPC, the Mn may also be obtained from calculation based on the dynamic viscosity of said polymer.

The main advantage of these compositions and the resultant gel or elastomer are that they cure and adhere to substrates at room temperature, are more resistant to contaminants than platinum cure silicones and they do not undergo reversion at temperatures above 80° C. indeed not only do they cure at room temperature but they also develop adhesion to substrates at room temperature, while addition cure system will only develop adhesion when heated above 80° C., which in some applications may be a problem, since some devices may be sensitive to high temperature or because heating big devices may be prohibitive from an energy and cost stand point.

The titanate/zirconate catalyst is useful to obtain a reversion free system when subjected to high temperature and/or high humidity.

High thermal conductivity can be obtained, for example around 2 W/mK or above using silicone compositions exhibiting a relatively low viscosity, i.e. from 150,000 to 400,000 mPa·s in consideration of the high loading of the filler, i.e. at least 50 wt. %, alternatively from 70 to 95 wt %, from 70 to 93 wt %, alternatively, 80 to 90 wt % of the total composition, after the two parts are mixed together.

The heat conductive silicone adhesive composition for use with reactors according to the invention, even when heavily loaded with a heat conductive filler so that the composition may be highly heat conductive, maintains good flow, can be potted around delicate substrates, has good physical properties after curing, experiences little changes of physical properties with heat or moist-heat aging, and has good adhesion to metals and organic resins. Also a reactor potted in the composition is provided. This ensures reliable performance of the reactor for applying the battery voltage across the motor after boosting up.

Polymer (i) is at least one or alternatively a moisture/condensation curable silyl terminated polymer. Any suitable moisture/condensation curable silyl terminated polymer may be utilised including polydialkyl siloxanes, alkylphenyl siloxane, or organic based polymers with silyl terminal groups e.g. silyl polyethers, silyl acrylates and silyl terminated polyisobutylenes or copolymers of any of the above. Polymer (i) may be selected from polysiloxane based polymer containing at least one hydroxyl, most preferably the polymer comprises two terminal hydroxyl groups.

Examples of suitable hydroxyl groups include $-Si(OH)_3$, $-(R^a)Si(OH)_2$, $-(R^a)_2Si(OH)$, or $-(R^a)_2Si-R^c-SiR^d_p(OH)_{3-p}$ where each $R^a$ independently represents a monovalent hydrocarbyl group, for example, an alkyl group, in particular having from 1 to 8 carbon atoms, (and is preferably methyl); each $R^d$ group is independently an alkyl group in which the alkyl groups suitably have up to 6 carbon atoms; $R^c$ is a divalent hydrocarbon group having up to 12 carbon atoms which may be interrupted by one or more siloxane spacers having up to six silicon atoms; and p has the value 0, 1 or 2.

Preferably polymer (i) has the general formula $$X^3\text{-}A\text{-}X^1 \qquad (1)$$

where $X^3$ and $X^1$ are independently selected from siloxane groups which terminate in hydroxyl groups and A is a siloxane and/or organic containing polymeric chain, alternatively a siloxane polymeric chain.

Examples of hydroxyl-terminating or hydrolysable groups $X^3$ or $X^1$ include $-Si(OH)_3$, $-(R^a)Si(OH)_2$, $-(R^a)_2\ Si(OH)$, or $-(R^a)_2Si-R^c-Si(R^d)_p(OH)_{3-p}$ as defined above. Preferably the $X^3$ and/or $X^1$ terminal groups are hydroxydialkyl silyl groups, e.g. hydroxydimethyl silyl groups.

Examples of suitable siloxane groups in polymeric chain A of formula (1) are those which comprise a polydiorganosiloxane chain. Thus polymeric chain A preferably includes siloxane units of formula (2)

$$-(R^5_sSiO_{(4-s)/2})- \qquad (2)$$

in which each $R^5$ is independently an organic group such as a hydrocarbyl group having from 1 to 10 carbon atoms optionally substituted with one or more halogen group such as chlorine or fluorine and s is 0, 1 or 2, typically s is about 2. Particular examples of groups $R^5$ include methyl, ethyl, propyl, butyl, vinyl, cyclohexyl, phenyl, tolyl group, a propyl group substituted with chlorine or fluorine such as 3,3,3-trifluoropropyl, chlorophenyl, beta-(perfluorobutyl) ethyl or chlorocyclohexyl group. Suitably, at least some and preferably substantially all of the groups $R^5$ are methyl.

Typically the polymers of the above type will have a viscosity in the order of 1,000 to 300,000 mPa·s, alternatively 1,000 to 100,000 mPa·s at 23° C. measured by using a Brookfield cone plate viscometer (RV DIII) using a cone plate.

Typical polymer (i) containing units of formula (2) are thus polydiorganosiloxanes having terminal, silicon-bound hydroxyl groups or terminal, silicon-bound organic radicals which can be hydrolysed using moisture as defined above. The polydiorganosiloxanes may be homopolymers or copolymers. Mixtures of different polydiorganosiloxanes having terminal condensable groups are also suitable.

The polymer (i) may alternatively be an organic based polymer having silyl terminal groups, each bearing at least one hydrolysable group. Typical silyl terminated polymers groups include silyl terminated polyethers, silyl terminated acrylates and silyl terminated polyisobutylenes. The sily groups utilised will be one or more alternatives described above as $X_1$, and $X_3$ as discussed above.

In the case of silyl polyethers, the polymer chain is based on polyoxyalkylene based units (organic). Such polyoxyalkylene units preferably comprise a linear predominantly oxyalkylene polymer comprised of recurring oxyalkylene units, $(-C_nH_{2n}-O-)$ illustrated by the average formula $(-C_nH_{2n}-O-)_m$ wherein n is an integer from 2 to 4 inclusive and m is an integer of at least four. The number average molecular weight of each polyoxyalkylene polymer block may range from about 300 g/mol to about 10,000 g/mol, but can be higher. Moreover, the oxyalkylene units are not necessarily identical throughout the polyoxyalkylene monomer, but can differ from unit to unit. A polyoxyalkylene block or polymer, for example, can be comprised of oxyethylene units, $(-C_2H_4-O-)$; oxypropylene units $(-C_3H_6-O-)$; or oxybutylene units, $(-C_4H_8-O-)$; or mixtures thereof.

Other polyoxyalkylene units may include for example: units of the structure $$-[-R^e-O-(-R^f-O-)_w\text{-Pn-}CR^g_2\text{-Pn-O}-(-R^f-O-)_q-R^e]-$$

in which Pn is a 1,4-phenylene group, each $R^e$ is the same or different and is a divalent hydrocarbon group having 2 to 8 carbon atoms, each $R^f$ is the same or different and, is, an ethylene group or propylene group, each $R^g$ is the same or different and is, a hydrogen atom or methyl group and each of the subscripts w and q is a positive integer in the range from 3 to 30.

For the purpose of this application "substituted" means one or more hydrogen atoms in a hydrocarbon group has been replaced with another substituent. Examples of such substituents include, but are not limited to, halogen atoms such as chlorine, fluorine, bromine, and iodine; halogen atom containing groups such as chloromethyl, perfluorobutyl, trifluoroethyl, and nonafluorohexyl; oxygen atoms; oxygen atom containing groups such as (meth)acrylic and carboxyl; nitrogen atoms; nitrogen atom containing groups such as amino-functional groups, amido-functional groups, and cyano-functional groups; sulphur atoms; and sulphur atom containing groups such as mercapto groups.

Crosslinkers (ii) that can be used are generally moisture curing
  silanes having at least 2 hydrolysable groups, alternatively at least 3 hydrolysable groups per molecule group; and/or
  silyl functional molecules having at least 2 silyl groups, each silyl group containing at least one hydrolysable group.

In some instances, the crosslinker (ii) having two hydrolysable groups may be considered a chain extender, i.e. when polymer (i) only has 1 or two reactive groups, but can be used to cross-link if polymer (i) has 3 or more reactive groups per molecule. The crosslinker (ii) may thus have two but alternatively has three or four silicon-bonded condensable (preferably hydroxyl and/or hydrolysable) groups per molecule which are reactive with the condensable groups in polymer (i).

For the sake of the disclosure herein silyl functional molecule is a silyl functional molecule containing two or more silyl groups, each silyl group containing at least one hydrolysable group. Hence, a disilyl functional molecule comprises two silicon atoms each having at least one hydrolysable group, where the silicon atoms are separated by an organic or siloxane spacer. Typically, the silyl groups on the disilyl functional molecule may be terminal groups. The spacer may be a polymeric chain.

The hydrolysable groups on the silyl groups include acyloxy groups (for example, acetoxy, octanoyloxy, and benzoyloxy groups); ketoximino groups (for example dimethyl ketoximo, and isobutylketoximino); alkoxy groups (for example methoxy, ethoxy, and propoxy) and alkenyloxy groups (for example isopropenyloxy and 1-ethyl-2-methylvinyloxy). In some instances, the hydrolysable group may include hydroxyl groups.

The silane cross-linker (ii) may include alkoxy functional silanes, oximosilanes, acetoxy silanes, acetonoxime silanes and/or enoxy silanes.

When the crosslinker is a silane and when the silane has only three silicon-bonded hydrolysable groups per molecule, the fourth group is suitably a non-hydrolysable silicon-bonded organic group. These silicon-bonded organic groups are suitably hydrocarbyl groups which are optionally substituted by halogen such as fluorine and chlorine. Examples of such fourth groups include alkyl groups (for example methyl, ethyl, propyl, and butyl); cycloalkyl groups (for example cyclopentyl and cyclohexyl); alkenyl groups (for example vinyl and allyl); aryl groups (for example phenyl, and tolyl); aralkyl groups (for example 2-phenylethyl) and groups obtained by replacing all or part of the hydrogen in the preceding organic groups with halogen. The fourth silicon-bonded organic groups may be methyl.

A typical silane may be described by formula (3)

wherein $R^5$ is described above and r has a value of 2, 3 or 4. Typical silanes are those wherein R" represents methyl, ethyl or vinyl or isobutyl. R" is an organic radical selected from linear and branched alkyls, allyls, phenyl and substituted phenyls, acetoxy, oxime. In some instances, $R^5$ represents methyl or ethyl and r is 3.

Another type of suitable crosslinkers (ii) are molecules of the type $Si(OR^5)_4$ where $R^5$ is as described above, alternatively propyl, ethyl or methyl. Partials condensates of $Si(OR^5)_4$ may also be considered.

In one embodiment the cross-linker (ii) is a silyl functional molecule having at least 2 silyl groups each having at least 1 and up to 3 hydrolysable groups, alternatively each silyl group has at least 2 hydrolysable groups.

The crosslinker (ii) may be a disilyl functional polymer, that is, a polymer containing two silyl groups, each containing at least one hydrolysable group such as described by the formula (4)

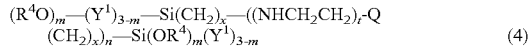

where $R^4$ is a $C_{1-10}$ alkyl group, $Y^1$ is an alkyl groups containing from 1 to 8 carbons, Q is a chemical group containing a heteroatom with a lone pair of electrons e.g. an amine, N-alkylamine or urea; each x is an integer of from 1 to 6, t is 0 or 1; each m is independently 1, 2 or 3 and n is 0 or 1.

The silyl (e.g. disilyl) functional crosslinker (ii) may have a siloxane or organic polymeric backbone. Suitable polymeric crosslinkers (ii) may have a similar polymeric backbone chemical structure to polymeric chain A as depicted in formula (1) above. In the case of such siloxane or organic based cross-linkers the molecular structure can be straight chained, branched, cyclic or macromolecular, i.e. a silicone or organic polymer chain bearing alkoxy functional end groups include polydimethylsiloxanes having at least one trialkoxy terminal where the alkoxy group may be a methoxy or ethoxy group.

In the case of siloxane based polymers the viscosity of the cross-linker will be within the range of from 0.5 mPa·s to 80,000 mPa·s at 23° C. using a Brookfield cone plate viscometer (RV DIII) utilising a cone plate (measured in the same manner as polymer (i)). Whilst any of the hydrolysable groups mentioned above are suitable it is preferred that the hydrolysable groups are alkoxy groups and as such the terminal silyl groups may have the formula such as —$R^aSi(OR^b)_2$, —$Si(OR^b)_3$, —$R^a{}_2SiOR^b$, or —$(R^a)_2Si$—$R^c$—$SiR^d{}_p(OR^b)_{3-p}$ where each $R^a$ independently represents a monovalent hydrocarbyl group, for example, an alkyl group, in particular having from 1 to 8 carbon atoms, (and is preferably methyl); each $R^b$ and $R^d$ group is independently an alkyl group having up to 6 carbon atoms; $R^c$ is a divalent hydrocarbon group which may be interrupted by one or more siloxane spacers having up to six silicon atoms; and p has the value 0, 1 or 2. Typically each terminal silyl group will have 2 or 3 alkoxy groups.

Crosslinkers (ii) thus include alkyltrialkoxysilanes such as methyltrimethoxysilane (MTM) and methyltriethoxysilane, tetraethoxysilane, partially condensed tetraethoxysilane, alkenyltrialkoxy silanes such as vinyltrimethoxysilane and vinyltriethoxysilane, isobutyltrimethoxysilane (iBTM). Other suitable silanes include ethyltrimethoxysilane, vinyltriethoxysilane, phenyltrimethoxysilane, alkoxytrioximosilane, alkenyltrioximosilane, 3,3,3-trifluoropropyltrimethoxysilane, methyltriacetoxysilane, vinyltriacetoxysilane, ethyl triacetoxysilane, di-butoxy diacetoxysilane, phenyl-tripropionoxysilane, methyltris(methylethylketoximo)silane, vinyltris-methylethylketoximo)silane, methyltris(methylethylketoximino)silane, methyltris(isopropenoxy)silane, vinyltris (isopropenoxy)silane, ethylpolysilicate, n-propylorthosilicate, ethylorthosilicate, dimethyltetraacetoxydisiloxane, oximosilanes, acetoxy silanes, acetonoxime silanes, enoxy silanes and other such trifunctional alkoxysilanes as well as partial hydrolytic condensation products thereof; 1,6-bis (trimethoxysilyl)hexane,bis (trialkoxysilylalkyl)amines, bis (dialkoxyalkylsilylalkyl) amine, bis (trialkoxysilylalkyl) N-alkylamine, bis (dialkoxyalkylsilylalkyl) N-alkylamine, bis (trialkoxysilylalkyl)urea, bis (dialkoxyalkylsilylalkyl) urea, bis (3-trimethoxysilylpropyl)amine, bis (3-triethoxysilylpropyl)amine, bis (4-trimethoxysilylbutyl)amine, bis (4-triethoxysilylbutyl)amine, bis (3-trimethoxysilylpropyl)N-methylamine, bis (3-triethoxysilylpropyl) N-methylamine, bis (4-trimethoxysilylbutyl) N-methylamine, bis (4-triethoxysilylbutyl) N-methylamine, bis (3-trimethoxysilylpropyl)urea, bis (3-triethoxysilylpropyl)urea, bis (4-trimethoxysilylbutyl)urea, bis (4-triethoxysilylbutyl)urea, bis (3-dimethoxymethylsilylpropyl)amine, bis (3-diethoxymethyl silylpropyl)amine, bis (4-dimethoxymethylsilylbutyl) amine, bis (4-diethoxymethyl silylbutyl)amine, bis (3-dimethoxymethylsilylpropyl) N-methylamine,
bis (3-diethoxymethyl silylpropyl) N-methylamine,
bis (4-dimethoxymethylsilylbutyl) N-methylamine,
bis (4-diethoxymethyl silylbutyl) N-methylamine, bis (3-dimethoxymethylsilylpropyl)urea, bis (3-diethoxymethyl silylpropyl)urea, bis (4-dimethoxymethylsilylbutyl)urea,
bis (4-diethoxymethyl silylbutyl)urea, bis (3-dimethoxyethylsilylpropyl)amine,
bis (3-diethoxyethyl silylpropyl)amine, bis (4-dimethoxyethylsilylbutyl)amine,
bis (4-diethoxyethyl silylbutyl)amine, bis (3-dimethoxyethylsilylpropyl) N-methylamine, bis (3-diethoxyethyl silylpropyl) N-methylamine, bis (4-dimethoxyethylsilylbutyl) N-methylamine,
bis (4-diethoxyethyl silylbutyl) N-methylamine, bis (3-dimethoxyethylsilylpropyl)urea bis (3-diethoxyethyl silylpropyl)urea, bis (4-dimethoxyethylsilylbutyl)urea and/or bis (4-diethoxyethyl silylbutyl)urea; bis (triethoxysilylpropyl)amine, bis (trimethoxysilylpropyl)amine, bis (trimethoxysilylpropyl)urea, bis (triethoxysilylpropyl)urea, bis (diethoxymethylsilylpropyl)N-methylamine; Di or Trialkoxy silyl terminated polydialkyl siloxane, di or trialkoxy silyl terminated polyarylalkyl siloxanes, di or trialkoxy silyl terminated polypropyleneoxide, polyurethane, polyacrylates; polyisobutylenes; Di or triacetoxy silyl terminated polydialkyl; polyarylalkyl siloxane; Di or trioximino silyl terminated polydialkyl; polyarylalkyl siloxane; Di or triacetonoxy terminated polydialkyl or polyarylalkyl. The cross-linker (ii) used may also comprise any combination of two or more of the above.

The molar ratio of total silicon bonded hydroxyl groups to total hydrolysable groups is between 0.5:1 to 2:1 using a silane cross-linker or 0.5:1 to 10:1, alternatively 0.5:1 to 10:1, alternatively 0.75:1 to 3:1, alternatively 0.75:1 to 1.5:1 using a silyl functional cross-linker.

The composition further comprises a condensation catalyst. This increases the speed at which the composition cures. The catalyst chosen for inclusion in a particular silicone composition depends upon the speed of cure required.

Titanate and/or zirconate based catalysts may comprise a compound according to the general formula Ti[OR$^{22}$]$_4$ or Zr[OR$^{22}$]$_4$ where each R$^{22}$ may be the same or different and represents a monovalent, primary, secondary or tertiary aliphatic hydrocarbon group which may be linear or branched containing from 1 to 10 carbon atoms. Optionally the titanate and/or zirconate may contain partially unsaturated groups. Examples of R$^{22}$ include but are not restricted to methyl, ethyl, propyl, isopropyl, butyl, tertiary butyl and a branched secondary alkyl group such as 2, 4-dimethyl-3-pentyl. Alternatively, when each R$^{22}$ is the same, R$^{22}$ is an isopropyl, branched secondary alkyl group or a tertiary alkyl group, in particular, tertiary butyl. Suitable titanate examples include tetra n-butyl titanate, tetra t-butyl titanate, titanium tetrabutoxide and tetraisopropyl titanate. Suitable zirconate examples include tetra-n-propyl zirconate, tetra-n-butyl zirconate and zirconium diethylcitrate.

Alternatively, the titanate and/or zirconate may be chelated. The chelation may be with any suitable chelating agent such as an alkyl acetylacetonate such as methyl or ethylacetylacetonate. Alternatively, the titanate may be monoalkoxy titanates bearing three chelating agents such as for example 2-propanolato, tris isooctadecanoato titanate or diisopropyldiethylacetoacetate titanate.

The molar ratio of catalyst M-OR functions to the hydroxyl and/or hydrolysable groups in polymer (i) is comprised between 0.01:1 and 0.5:1, where M is titanium or zirconium.

The thermally conductive filler (iv) may be a single thermally conductive filler or a combination of two or more thermally conductive fillers that differ in at least one property such as particle shape, average particle size, particle size distribution, and type of filler. Due to the nature of the end use, thermally conductive compositions as described herein may comprise as much as from 70% to 95, e.g. 70% to 93% thermally conductive filler (as discussed above). Any suitable thermally conductive fillers may be utilised. Examples include aluminium, aluminium oxide, zinc and zinc oxide fillers, In some embodiments, combinations of metallic and inorganic fillers, such as a combination of aluminium and aluminium oxide fillers; a combination of aluminium and zinc oxide fillers; or a combination of aluminium, aluminium oxide, and zinc oxide fillers may be used.

Alternatively, it may be desirable to use combinations of metallic fillers, such as a first aluminium having a larger average particle size and a second aluminium having a smaller average particle size. Use of a first filler having a larger average particle size and a second filler having a smaller average particle size than the first filler may improve packing efficiency, may reduce viscosity, and may enhance heat transfer.

The shape of the thermally conductive filler particles is not specifically restricted, however, rounded or spherical particles may prevent viscosity increase to an undesirable level upon high loading of the thermally conductive filler in the composition. The average particle size of the thermally conductive filler will depend on various factors including the type of thermally conductive filler selected and the exact amount added to the curable composition, as well as the bondline thickness of the device in which the cured product of the composition will be used.

In some particular instances, the thermally conductive filler may have an average particle size ranging from 0.1 micrometre to 80 micrometres, alternatively 0.1 micrometre to 50 micrometres, and alternatively 0.1 micrometre to 10 micrometres.

In one preferred embodiment there is provided a mixture of thermally conductive fillers. The fillers may or may not be the same chemical compound but are differentiated by average particle size with for example a mixture of two or more of a) a thermally conductive filler having an average particle size value of from 20 to 80 micrometers, alternatively 30 to 50 micrometers and/or b) a thermally conductive filler having an average particle size value of from 2 to 10 micrometers, alternatively 2 to 6 micrometers and/or c) a thermally conductive filler having an average particle size value of from 0.1 to 1 to micrometers, alternatively 0.2 to 0.8 micrometers.

Any suitable thermally conductive filler is usable as component (iv). Examples include metals e.g. bismuth, lead, tin, antimony, indium, cadmium, zinc, silver, copper, nickel, aluminum, iron and silicon metal. As an alloy of bismuth, lead, tin, antimony, indium, cadmium, zinc, silver, aluminum, an alloy consisting of two or more metals selected from the group consisting of iron and silicon metal. As the metal oxide, alumina, zinc oxide, silicon oxide, magnesium oxide, beryllium oxide, and a chromium oxide and titanium oxide. As metal hydroxide, magnesium hydroxide, aluminum hydroxide, barium hydroxide and calcium hydroxide. As the metal nitride, boron nitride include aluminum nitride and silicon nitride. The metal carbide, silicon carbide, include boron carbide and titanium carbide. As the metal silicide, magnesium silicide, titanium silicide, silicide, zirconium, tantalum silicide, niobium silicide, chromium silicide, and a tungsten silicide and molybdenum silicide. As the carbon, diamond, graphite, fullerene, carbon nanotubes, graphene, include activated carbon and amorphous carbon black. The soft magnetic alloy, Fe—Si alloy, Fe—Al alloy, Fe—Si—Al alloy, Fe—Si—Cr alloy, Fe—Ni alloy, Fe—Ni—Co alloy, Fe—Ni—Mo alloy, Fe—Co alloy, Fe—Si—Al—Cr alloys, Fe—Si—B alloy and Fe—Si—Co—B alloy. As the ferrite, Mn—Zn ferrite, Mn—Mg—Zn ferrite, Mg—Cu—Zn ferrite, Ni—Zn ferrite, and a Ni—Cu—Zn ferrite and Cu—Zn ferrite.

Preferably, thermally conductive filler (iv) is at least one or more kinds of powder and/or fibers selected from silver powder, aluminum powder, aluminum oxide powder, zinc oxide powder, aluminum powder or graphite nitride. In a further alternative the Further, in the present compositions, if the electrical insulation is required, it is preferred that the metal oxide powder, or a metal nitride powder, in particular. In one embodiment the filler (iv) is a mixture of aluminium oxides, which are optionally pre-treated, having various size, enables optimum packing and low viscosity.

The thermally conductive fillers may be meltable fillers and may comprise Bi, Ga, In, Sn, or an alloy thereof. The meltable filler may optionally further comprise Ag, Au, Cd, Cu, Pb, Sb, Zn, or a combination thereof. Examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The meltable filler may have a melting point ranging from 50° C. to 250° C., alternatively 150° C. to 225° C. The meltable filler may be a eutectic alloy, a non-eutectic alloy, or a pure metal. Meltable fillers are commercially available.

The thermally conductive filler and/or the anhydrous reinforcing and/or extending filler if present, may optionally be surface treated with a treating agent. Treating agents and treating methods are known in the art, The surface treatment of the filler(s) is typically performed, for example with a fatty acid or a fatty acid ester such as a stearate, or with organosilanes, organosiloxanes, or organosilazanes such as hexaalkyl disilazane or short chain siloxane diols. Generally the surface treatment renders the filler(s) hydrophobic and therefore easier to handle and obtain a homogeneous mixture with the other components in the composition. Silanes such as

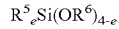

wherein $R^5$ is a substituted or unsubstituted monovalent hydrocarbon group of 6 to 20 carbon atoms, for example, alkyl groups such as hexyl, octyl, dodecyl, tetradecyl, hexadecyl, and octadecyl, and aralkyl groups such as benzyl and phenylethyl, with the alkyl groups of 6 to 20 carbon atoms being preferred. $R^6$ is an alkyl group of 1 to 6 carbon atoms, and letter e is equal to 1, 2 or 3 may also be utilised as the treating agent for fillers.

The present cured gel or elastomer is typically made from the condensation curable gel or elastomer composition which is stored in a 2 part manner. The two part compositions may be mixed using any appropriate standard two-part mixing equipment with a dynamic or static mixer and is optionally dispensed therefrom for use in the application for which it is intended.

In one embodiment the condensation curable gel composition is stored in two parts said parts may be divided as follows
a) polymer(i) and cross-linker (ii) in one part and polymer (i) and catalyst (iii) in the other part;
b) cross-linker (ii) in one part and polymer (i) and catalyst (iii) in the other part or
c) when more than one polymer (i) is being utilised a first polymer(i) and cross-linker (ii) in one part and a second polymer (i) and catalyst (iii) in the other part
d) polymer (i) in one part and the cross-linker (ii) and catalyst (iii) in the other part.

In each case, if optional filler is present, in particular moisture containing filler, the filler and catalyst are not in the same part. Typically, when present, filler is mixed with polymer (i) in a base part which may also contain other additives.

The thermally conductive filler may be present in either one or both parts of a two part composition.

Other than the above components optional components may be blended in the silicone gel composition within a range such that the object of the present invention is achieved. Examples of optional components include anhydrous reinforcing and/or anhydrous extending fillers, heat resistance-imparting agents, cold resistance-imparting agents, flame retarders, thixotropy-imparting agents, pigments, adhesion promoter, surfactant, flux agent, acid acceptor, anti-corrosion additives, dyes and any suitable combination thereof.

Should the need arise the composition may incorporate other types of fillers which may or may not be anhydrous, for example electrically conductive fillers e.g. metallic fillers and inorganic fillers, or a combination thereof. Metallic fillers include particles of metals and particles of metals having layers on the surfaces of the particles. These layers may be, for example, metal nitride layers or metal oxide layers on the surfaces of the particles. Suitable metallic fillers are exemplified by particles of metals selected from the group consisting of aluminium, copper, gold, nickel, tin, silver, and combinations thereof, and alternatively aluminium. Suitable metallic fillers are further exemplified by particles of the metals listed above having layers on their surfaces selected from the group consisting of aluminium nitride, aluminium oxide, copper oxide, nickel oxide, silver oxide, and combinations thereof. For example, the metallic filler may comprise aluminium particles having aluminium oxide layers on their surfaces.

Inorganic fillers which are anhydrous and may be exemplified by onyx; aluminium trihydrate, carbon black, hollow glass beads, metal oxides such as aluminium oxide, beryllium oxide, magnesium oxide, and zinc oxide; nitrides such as aluminium nitride and boron nitride; carbides such as silicon carbide and tungsten carbide; and combinations thereof. Further fillers may include barium titanate, carbon fibres, diamond, graphite, magnesium hydroxide, and a combination thereof.

Examples of anhydrous reinforcing and/or anhydrous extending fillers include precipitated and ground silica, precipitated and ground calcium carbonate, treated silicas, glass beads, carbon black, graphite, carbon nanotubes, quartz, talc, chopped fibre such as chopped KEVLAR®, or a combination thereof. The filler can also be a siloxane resin comprising $R_3SiO_{1/2}$ units and $SiO_{4/2}$ units, where R is a hydroxyl or a hydrocarbon radical bound directly or via an oxygen atom to the silicon atom. These optional fillers may also be treated by the filler treating agents as hereinbefore described.

Suitable adhesion promoters include alkoxysilanes of the formula $R^{14}{}_hSi(OR^{15})_{(4-h)}$, where subscript h is 1, 2, or 3, alternatively h is 3. Each $R^{14}$ is independently a monovalent organofunctional group. $R^{14}$ can be an epoxy functional group such as glycidoxypropyl or (epoxycyclohexyl)ethyl, an amino functional group such as aminoethylaminopropyl or aminopropyl, a methacryloxypropyl, a mercapto functional group such as mercaptopropyl or an unsaturated organic group. Each $R^{15}$ is independently an unsubstituted, saturated hydrocarbon group of at least 1 carbon atom. $R^{15}$ may have 1 to 4 carbon atoms, alternatively 1 to 2 carbon atoms. $R^{15}$ is exemplified by methyl, ethyl, n-propyl, and iso-propyl.

When using an adhesion promoter, the composition shows good adhesion to various substrates, especially if the filler has been pre-treated. In compositions containing non pre-treated fillers, good adhesion is obtained typically with the use of a primer prior to the application.

Further examples of suitable adhesion promoters include glycidoxypropyltrimethoxysilane and a combination of glycidoxypropyltrimethoxysilane with an aluminium chelate or zirconium chelate.

The curable composition may comprise, when present, 0.01% to 2 wt. %, alternatively 0.05 to 2 wt. %, alternatively 0.1 to 1 wt. % of adhesion promoter based on the weight of the composition. Preferably, the speed of hydrolysis of the adhesion promoter should be lower than the speed of hydrolysis of the cross-linker in order to favour diffusion of the molecule towards the substrate rather than its incorporation in the product network.

Suitable surfactants include silicone polyethers, ethylene oxide polymers, propylene oxide polymers, copolymers of ethylene oxide and propylene oxide, other non-ionic surfactants, and combinations thereof. The composition may comprise up to 0.05% of the surfactant based on the weight of the composition.

The composition may comprise up to 2% of a flux agent based on the weight of the composition. Molecules containing chemically active functional groups such as carboxylic acid and amines can be used as flux agents. Such flux agents can include aliphatic acids such as succinic acid, abietic acid, oleic acid, and adipic acid; aromatic acids such as benzoic acids; aliphatic amines and their derivatives, such as triethanolamine, hydrochloride salts of amines, and hydrobromide salts of amines. Flux agents are known in the art and are commercially available.

Suitable acid acceptors include magnesium oxide, calcium oxide, and combinations thereof. The composition may comprise up to 2% of acid acceptor based on the weight of the composition, if appropriate.

Examples of anti-corrosion additives include nitrogen/sulphur containing heterocyclic compounds containing a triazole structure, a thiadiazole structure, a benzotriazole structure, a mercaptothiozole structure, a mercaptobenzothiazole structure or a benzimidazole structure.

There is also provided herein a method of making the elastomer or gel as hereinbefore described whereby the aforementioned two parts of the composition are intermixed and cured. Subsequent to intermixing in one embodiment the condensation curable gel composition may be applied on to a substrate using a suitable dispenser such as for example curtain coaters, spray devices die coaters, dip coaters, extrusion coaters, knife coaters and screen coaters which upon gel formation is provides a coating on said substrate.

Gels or elastomers in accordance with the above may be utilised in a wide variety of applications, including, for the sake of example as an encapsulant/pottant in an electronic article.

The article may be a power electronic article e.g. an electronic component with gel disposed thereon such The article may be a power electronic article e.g. an electronic component with material composition disposed thereon such that the cured material encapsulates, either partially or completely, the electronic component. Alternatively the electronic article may be an integrated circuit (IC), or light emitting diodes (LED) system or may be a printed circuit board (PCB).

The silicone material as hereinbefore described is designed for use in optical applications and electronics applications, including both microelectronics and macroelectronics applications as well as optoelectronics applications and thermally conductive electronics applications, such as making thermally conductive adhesives. Furthermore, the silicone material of the present invention may be transparent and therefore are potentially suitable for use in light-emitting semiconductor elements such as LEDs.

Cured silicone adhesives prepared from such a curable silicone composition may adhere to various substrates such as electrical or electronic components and/or parts, not least metal substrates such as gold, silver, aluminum, copper, and electroless nickel; as well as polymeric substrates such as FR4, Nylon, polycarbonate, Lucite (which is polymethylmethacrylate, PMMA), polybutylene terephthalate (PBT), and liquid crystal polymers such as Xydar®, available from Solvay Chemicals, Houston, Tex. 77098 USA.

The electrical or electronic components and/or parts may be filled with the silicone material by any appropriate method by, for example, contacting the portion of the electrical or electronic part to be protected with the silicone material, and then curing this composition by through condensation cure i.e. by letting it stand at room temperature.

Any suitable electrical or electronic part may be sealed with the silicone material as described above but because the silicone material of the present invention can suppress the occurrence of air bubbles and cracks and exhibits good bonding to electrical or electronic parts even under high-temperature conditions, it can be advantageously used in power devices used under high-temperature conditions, particularly power devices such as a motor control, a motor control for transport, a power generation system, or a space transportation system.

Furthermore, because the silicone material of the present invention has a certain degree of cold resistance in addition to the heat resistance demanded in an Si—C semiconductor chip (for example, heat resistance of 180° C. or above). The electronic article can be a power module, e.g. one of more of the aforementioned devices for power converters, inverters, boosters, traction controls, industrial motor controls, power distribution and transportation systems, especially in power devices that demand the ability to withstand sharp temperature differences, and can improve the durability and reliability of such power devices.

Examples of such power devices that demand heat resistance and cold resistance include motor controls used in cold regions such as general-purpose inverter controls, servo motor controls, machine tools or elevators, electric vehicles, hybrid cars or motor controls for rail transport used in cold regions, power generating systems used in cold regions such as solar, wind or fuel cell power generators, space transportation systems used in space, and the like. Note that "cold regions" indicates regions where the temperature falls below 0° C.

Furthermore, the silicone material is also effective in sealing electrical or electronic parts having a structure in which the space between electrodes, between electrical elements or between an electrical element and the package in the electrical or electronic part is narrow, or having a structure in which these structures cannot track to the expansion and contraction of the silicone material. For example, it may be used in electrical circuits or modules on which electrical elements such as semiconductor elements, capacitors and resistors are mounted, i.e., various sensors such as pressure sensors that are generally sealed or filled with silicone material, and automotive igniters, regulators and the like.

The electronic component may be defined as a chip, such as a silicon chip or a silicon carbide chip, one or more wires, one or more sensors, one or more electrodes, integrated circuits (ICs), e.g. hybrid ICs, power devices, insulated gate bipolar transistor (IGBT), a rectifier such as a Schottky diode, a PiN diode, a merged PiN/Schottky (MPS) rectifier and Junction barrier diode, a bipolar junction transistors (BJTs), a thyristor, a metal oxide field effect transistor (MOSFET), a high electron mobility transistor (HEMT), a static induction transistors (SIT), a power transistor, and the like.

The electronic article may include the electronic component and a first layer. The first layer is not particularly limited and may be a semiconductor, a dielectric, metal, plastic, carbon fibre mesh, metal foil, a perforated metal foil (mesh), a filled or unfilled plastic film (such as a polyamide sheet, a polyimide sheet, polyethylene naphthalate sheet, a polyethylene terephthalate polyester sheet, a polysulphone sheet, a polyether imide sheet, or a polyphenylene sulphide sheet), or a woven or nonwoven substrate (such as fibreglass cloth, fibreglass mesh, or aramid paper). Alternatively, the first layer may be further defined as a semiconductor and/or dielectric film.

The silicone material may be sandwiched between the electronic component and the first layer, and/or may be disposed on and in direct contact with the first layer, and/or on and in direct contact with the electronic component. If the silicone material is disposed on and in direct contact with the first layer, the silicone material may still be disposed on the electronic component but may include one or more layers or structures between the silicone material and the electronic component.

The disclosure also provides a method of forming aforementioned electronic article. The method may include one or more of the aforementioned steps of forming the gel, the step of providing the gel, and/or the step of providing the electronic component.

Typically, the method includes applying the curable compositions as hereinbefore described onto an electronic component and curing the composition to form a gel on the electronic component under the condition sufficient to form the gel without damaging the component. The gel may be formed on the electronic component. Alternatively, the gel may be formed apart from the electronic component and subsequently be disposed on the electronic component.

There is also provided herein a method of making the gel as hereinbefore described whereby the aforementioned two parts of the composition are intermixed and cured.

Subsequent to intermixing in one embodiment the condensation curable gel composition may be applied on to a substrate using a suitable dispenser such as for example curtain coaters, spray devices die coaters, bead application, dip coaters, extrusion coaters, knife coaters and screen coaters which upon gel formation is provides a coating on said substrate.

The silicone gel described above has excellent heat resistance at high temperatures of 180° C. and above, and the gel does not tend to deteriorate when used for a long period at these high temperatures.

Furthermore, the gel is also effective in sealing electrical or electronic parts having a structure in which the space between electrodes, between electrical elements or between an electrical element and the package in the electrical or electronic part is narrow, or having a structure in which these structures cannot track to the expansion and contraction of the silicone gel. For example, it may be used in electrical circuits or modules on which electrical elements such as semiconductor elements, capacitors and resistors are mounted, i.e., various sensors such as pressure sensors that are generally sealed or filled with silicone gel, and automotive igniters, regulators and the like.

The disclosure also provides a method of forming aforementioned electronic article. The method may include one or more of the aforementioned steps of forming the gel, the step of providing the gel, and/or the step of providing the electronic component. Typically, the method includes the curable compositions as hereinbefore described onto an electronic component and curing the composition to form a gel on the electronic component under the condition sufficient to form the gel without damaging the component. The gel may be formed on the electronic component. Alternatively, the gel may be formed apart from the electronic component and subsequently be disposed on the electronic component.

EXAMPLES

Materials
  Thermally conductive Fillers
    Filler 1 is an aluminum oxide exhibiting an average particle size of about 40 μm (D50 determined by laser diffraction);
    Filler 2 is an aluminum oxide exhibiting an average particle size of about 3.1 μm (D50 determined by laser diffraction); and
    Filler 3 is an aluminum oxide exhibiting an average particle size of about 0.44 μm (D50 determined by laser diffraction).
  Adhesion promoter 1 is a mixture of
    53.5% by weight of methyl trimethoxysilane,
    27.4% by weight of 3-glycidoxypropyl trimethoxy silane and
    21.8% by weight of 3-aminopropyl triethoxy silane pre-condensed.

Example 1 to 3 and Comparative Examples

The base and curing agent formulations were prepared according to compositions described in Table 1. The different compositions were prepared as discussed below. All viscosity measurements were taken at 23° C. using a Brookfield cone plate viscometer (RV DIII) utilising the most appropriate cone plate for the viscosity unless otherwise indicated. The results obtained from the gels cured from said compositions are found in Table 2.

Base for Example 1, 2 and Comparative Example 1

18.15 g of OH dimethyl terminated polydimethylsiloxane having a viscosity of 2,000 mPa·s were mixed with 19.95 g of OH dimethyl terminated polydimethylsiloxane having a viscosity of 13,500 mPa·s in a speedmixer for 30 seconds at 2300 rpm. Then 198.22 g of filler 1 was added and mixed in a speedmixer for 30 seconds at 2300 rpm. Then 60.03 g of filler 2 was added and mixed in a speedmixer for 30 seconds at 2300 rpm. Finally, 33.64 g of filler 3 was added and mixed in a speedmixer for 30 seconds at 2300 rpm.

Base for Example 3

6.60 g of OH dimethyl terminated polydimethylsiloxane having a viscosity of 2,000 mPa·s were mixed with 7.26 g of OH dimethyl terminated polydimethylsiloxane having a viscosity of 13,500 mPa·s in a speedmixer for 30 seconds at 2300 rpm. Then 72.05 g of untreated filler 1 was added and mixed in a speedmixer for 30 seconds at 2300 rpm. Then 21.82 g of untreated filler 2 was added and mixed in a speedmixer for 30 seconds at 2300 rpm. Then, 12.23 g of untreated filler 3 was added and mixed in a speedmixer for 30 seconds at 2300 rpm. Finally, 0.05 g of tetra n-butyl titanate was added and mixed three times in a speedmixer for 30 seconds at 2300 rpm.

Curing Agent for Example 1

9.91 g of trimethoxysilyl terminated polydimethylsiloxane having a viscosity of 56,000 mPa·s was added in a container and mixed with 0.495 g of adhesion promoter 1. Then 26.94 g of filler 1 was added and mixed in a speedmixer for 30 seconds at 2300 rpm. Then 8.04 g of filler 2 was added and mixed in a speedmixer for 30 seconds at 2300 rpm. Then, 4.55 g of filler 3 was added and mixed in a speedmixer for 30 seconds at 2300 rpm. Finally, 0.074 g of tetra n-butyl titanate was added and mixed three times in a speedmixer for 30 seconds at 2300 rpm.

Curing Agent for Example 2

19.96 g of trimethoxysilyl terminated polydimethylsiloxane having a viscosity of 56,000 mPa·s was added in a container and mixed with 0.252 g of adhesion promoter 1. Then 27.07 g of filler 1 was added and mixed in a speedmixer for 30 seconds at 2300 rpm. Then 8.08 g of filler 2 was added and mixed in a speedmixer for 30 seconds at 2300 rpm. Then, 4.57 g of filler 3 was added and mixed three times in a speedmixer for 30 seconds at 2300 rpm. Finally, 0.075 g of tetra n-butyl titanate was added and mixed in a speedmixer for 30 seconds at 2300 rpm.

Curing Agent for Example 3

9.91 g of trimethoxysilyl terminated polydimethylsiloxane having a viscosity of 56,000 mPa·s was added in a container and mixed with 0.495 g of adhesion promoter 1. Then 26.94 g of untreated filler 1 was added and mixed in a speedmixer for 30 seconds at 2300 rpm. Then 8.04 g of untreated filler 2 was added and mixed in a speedmixer for 30 seconds at 2300 rpm. Then, 4.55 g of untreated filler 3 was added and mixed in a speedmixer for 30 seconds at 2300 rpm. Finally, 0.074 g of tetra n-butyl titanate was added and mixed three times in a speedmixer for 30 seconds at 2300 rpm.

About 95 g of the base was filled in a cylinder of a two part cartridge and about 40 g of the curing agent was filled in the other cylinder of the two part cartridge. The cartridge is a 2:1 volume ratio of base to curing agent. A static mixer was used to mix both ingredient from the cartridge and dispense the material to build the slabs.

TABLE 1

| Weight parts | Example 1 | Example 2 | Example 3 | Comparative example 1 |
|---|---|---|---|---|
| Base formulation - part 1 | | | | |
| OH terminated polydimethylsiloxane (viscosity ca 2,000 mPa · s) | 5.50 | 5.50 | 5.50 | 5.50 |
| OH terminated polydimethylsiloxane (viscosity ca 13,500 mPa · s) | 6.05 | 6.05 | 6.05 | 6.05 |
| Pre-treated aluminum oxide | 88.50 | 88.50 | | 88.50 |
| Aluminum oxide untreated | | | 88.50 | |
| Curing agent formulation - part 2 | | | | |
| Trimethoxysilyl terminated polydimethylsiloxane (viscosity ca 56,000 mPa · s) | 19.79 | 19.79 | 19.79 | 19.79 |
| Adhesion promoter 1 | 0.99 | 0.50 | 0.99 | 0.99 |
| Pre-treated aluminum oxide | 78.94 | 78.94 | | 78.94 |
| Aluminum oxide untreated | | | 78.94 | |
| Dimethyltin neodecanoate | | | | 0.15 |
| Tetra n-butyl titanate | 0.15 | 0.15 | 0.15 | |

The slabs were subsequently tested for lap shear strength and lap shear elongation following the present method, on anodized aluminium: two anodized aluminium substrates measuring 100×25×2 mm$^3$ where glued with the thermally conductive adhesive so that the bonding volume is 25×25×1 mm and left for cure at 23° C. 50% relative humidity during the specified period of time (7 Days or 28 Days). The lap shear specimen where mounted in a tensiometer (Zwick) using L shaped pinches to hold them and perform the testing. A preload of 0.05 MPa was applied at 5.5 mm/min speed. Lap shear testing was performed at 50 mm/min until force drops of 50% of the maximum force measured. At this point the elongation is measured (and recorded in %). The maximum force measured is reported as the lap shear strength (in MPa).

The Thermal conductivity was measured on TIMA tester in accordance with ASTM D5470-12. The testing was undertaken on 7 days cured samples having a thickness of of 1, 2 and 3 mm (all with a diameter of 7.83 mm) measured with an applied force of 2N. Under this force condition, combined with the softness of the product, conformal adhesion between the material and the measurement probe can be ensured.

Gel time was determined as the time by which a 30 ml aluminum cup filled with the material can be turn upside down without significant movement of the product.

Adhesion failure mode was determined on a bead of sealant applied on the substrate using a cutter to entail the sealant at the interface with the substrate and peel the material manually (finger peel testing). CF means cohesive failure, i.e. the failure occurs inside the elastomer. AF means adhesive failure, i.e. the failure occurs at the substrate/elastomer interface. Thermal shock was undertaken by having samples at +150° C. for 30 min and then changing to a temperature of −40° C. for 30 minutes with a chamber transition of <10 sec which leads to a temperature change from one extreme to the other in <3 min.

TABLE 2

| Results | Example 1 | Example 2 | Example 3 | Comparative example 1 |
|---|---|---|---|---|
| gel time (min) | 60 | 414 | 49 | 3 |
| 40° C. Thermal Conductivity (W/mK) | 1.92 | 1.72 | 1.90 | 1.82 |
| 7 D cure | | | | |
| Lap shear strength (MPa) | 0.86 | 0.83 | 0.59 | 1.19 |
| Lap shear Elongation (%) | 198 | 220 | 130 | 141 |
| Failure mode | 70% CF | 70% CF | 50% CF | 0% CF |
| 28 D cure | | | | |
| Lap shear strength (MPa) | 1.29 | 1.25 | 1.64 | 1.33 |
| Lap shear Elongation (%) | 197 | 240 | 195 | 128 |
| Failure mode | 50% CF | 70% CF | 30% CF | 30% CF |
| 7 D cure + 1000 h 85° C./85 RH | | | | |
| Lap shear strength (MPa) | 1.47 | 1.13 | 1.13 | 1.93 |
| Lap shear Elongation (%) | 212 | 222 | 225 | 154 |
| Failure mode | 100% CF | 90% CF | 90% CF | 90% CF |
| 7 D cure + 1000 h thermal shock | | | | |
| Lap shear strength (MPa) | 1.85 | 1.22 | 1.50 | 2.79 |
| Lap shear Elongation (%) | 235 | 237 | 243 | 177 |
| Failure mode | 70% CF | 50% CF | 100% CF | 30% CF |
| 7 D cure + 1000 h 150° C. | | | | |
| Lap shear strength (MPa) | 2.27 | 1.52 | 1.63 | 3.13 |
| Lap shear Elongation (%) | 222 | 250 | 239 | 181 |
| Failure mode | 100% CF | 100% CF | 100% CF | 50% CF |

Examples 1, 2 and 3 are showing a higher percentage of cohesion after failure on anodized aluminium than Comparative example 1, which highlights that titanate catalyzed based compositions according to the invention, even if slower to cure, are providing a superior adhesion profile than tin catalyzed based composition of Comparative example 1.

Moreover, the elongation at break is higher for titanate based formulations, which is a critical parameter for thermally conductive adhesives. Higher elongation and lower modulus formulations are more efficient materials to accommodate for the thermal stresses in the application.

The invention claimed is:

1. A reversion free multi-part, condensation curable, thermally conductive silicone adhesive composition comprising:
   (i) at least one condensation curable silyl terminated polymer having at least one hydroxyl functional group per molecule;
   (ii) a cross-linker selected from the group of:
     silanes having at least 2 hydrolysable groups per molecule, and/or
     silyl functional molecules having at least 2 silyl groups, each silyl group containing at least one hydrolysable group or a mixture thereof,
   (iii) at least one condensation catalyst selected from the group consisting of titanates and/or zirconates; and
   (iv) one or more thermally conductive fillers, present in an amount of from 70 to 93% of the composition by weight;

wherein polymer (i), cross-linker (ii) and condensation catalyst (iii) are not contained in the same part; and wherein the molar ratio of total silicon-bonded hydroxyl groups to total hydrolysable groups is between 0.2:1 to 2:1 using a silane cross-linker (ii) or 0.2:1 to 10:1 using a silyl functional molecule cross-linker (ii) and the molar ratio of condensation catalyst (iii) M-OR functions to the total silicon-bonded hydroxyl groups is between 0.01:1 and 0.5:1, where M is titanium or zirconium, and R is an aliphatic hydrocarbon group.

2. The reversion free multi-part, condensation curable, thermally conductive silicone adhesive composition in accordance with claim 1, wherein the composition is stored in two parts and where the parts are divided as follows:
   a) polymer (i) and cross-linker (ii) in one part and polymer (i) and condensation catalyst (iii) in the other part; or
   b) cross-linker (ii) in one part and polymer (i) and condensation catalyst (iii) in the other part; or
   c) a first polymer (i) and cross-linker (ii) in one part and a second polymer (i) and condensation catalyst (iii) in the other part; or
   d) polymer (i) in one part and cross-linker (ii) and condensation catalyst (iii) in the other part.

3. The reversion free multi-part, condensation curable, thermally conductive silicone adhesive composition in accordance with claim 2, wherein the thermally conductive filler (iv) is present in both parts of the composition, or is in a base part with polymer (i).

4. The reversion free multi-part, condensation curable, thermally conductive silicone adhesive composition in accordance with claim 1, wherein the thermally conductive filler (iv) is selected from the group consisting of silver powder, aluminum powder, aluminum oxide powder, zinc oxide powder, graphite nitride, and mixtures thereof.

5. The reversion free multi-part, condensation curable, thermally conductive silicone adhesive composition in accordance with claim 1, wherein the thermally conductive filler (iv) is:
   i) is mixture of aluminum oxides; or
   ii) a mixture of pre-treated aluminum oxides different sizes.

6. The reversion free multi-part, condensation curable, thermally conductive silicone adhesive composition in accordance with claim 4, wherein the thermally conductive fillers (iv) are differentiated by average particle size with a mixture of two or more of a) to c) below:
   a) a thermally conductive filler (iv) having an average particle size value of from 20 to 80 micrometers;
   b) a thermally conductive filler (iv) having an average particle size value of from 2 to 10 micrometers;
   c) a thermally conductive filler (iv) having an average particle size value of from 0.1 to 1 to micrometers.

7. A reversion free thermally conductive silicone adhesive cured from the reversion free multi-part, condensation curable, thermally conductive silicone adhesive composition in accordance with claim 1.

8. The reversion free thermally conductive silicone adhesive in accordance with claim 7, in the form of a gel or an elastomer.

9. A sealant for an electrical or electronic part, comprising the reversion free thermally conductive silicone adhesive in accordance with claim 7.

10. An electrical or electronic part encapsulated/potted with the gel of claim 8.

11. A method of making an adhesive, the method comprising:

intermixing a multi-part adhesive composition to form a mixture; and curing the mixture to form the adhesive;

wherein the multi-part adhesive composition is the reversion free multi-part, condensation curable, thermally conductive silicone adhesive composition according to claim 1.

12. Electrical or electronic equipment provided with a member made from curing the reversion free multi-part, condensation curable, thermally conductive silicone adhesive composition according to claim 1.

13. A heat radiating member for electric and electronic devices made from the reversion free multi-part, condensation curable, thermally conductive silicone adhesive composition according to claim 1.

14. The heat radiating member in accordance with claim 13, in the form of an interface between a semiconductor electronic component and a metal heat sink.

15. The reversion free multi-part, condensation curable, thermally conductive silicone adhesive composition in accordance with claim 1, wherein polymer (i) has at least 2 hydroxyl functional groups per molecule.

16. The reversion free multi-part, condensation curable, thermally conductive silicone adhesive composition in accordance with claim 1, wherein cross-linker (ii) is selected from the group consisting of silanes having at least 3 hydrolysable groups per molecule.

* * * * *